US008645776B2

(12) United States Patent
Byom et al.

(10) Patent No.: US 8,645,776 B2
(45) Date of Patent: Feb. 4, 2014

(54) RUN-TIME TESTING OF MEMORY LOCATIONS IN A NON-VOLATILE MEMORY

(75) Inventors: Matthew Byom, Campbell, CA (US);
Daniel J. Post, Campbell, CA (US);
Kenneth Herman, San Jose, CA (US);
Vadim Khmelnitsky, Foster City, CA (US)

(73) Assignee: Apple Inc., Cupertino, CA (US)

( * ) Notice: Subject to any disclaimer, the term of this patent is extended or adjusted under 35 U.S.C. 154(b) by 843 days.

(21) Appl. No.: 12/730,564

(22) Filed: Mar. 24, 2010

(65) Prior Publication Data
US 2011/0239065 A1   Sep. 29, 2011

(51) Int. Cl.
*G11C 29/00*   (2006.01)

(52) U.S. Cl.
USPC .......................................... 714/723; 714/763

(58) Field of Classification Search
USPC .......................................... 714/718, 723, 763
See application file for complete search history.

(56) References Cited

U.S. PATENT DOCUMENTS

| | | | |
|---|---|---|---|
| 4,570,217 A * | 2/1986 | Allen et al. ................. | 700/83 |
| 6,631,086 B1 | 10/2003 | Bill et al. | |
| 6,813,678 B1 * | 11/2004 | Sinclair et al. ............. | 711/103 |
| 6,823,507 B1 * | 11/2004 | Srinivasan et al. ......... | 717/152 |
| 6,834,364 B2 * | 12/2004 | Krech et al. ................ | 714/45 |
| 7,334,159 B1 | 2/2008 | Callaghan | |
| 7,447,869 B2 | 11/2008 | Kruger et al. | |
| 7,945,826 B2 | 5/2011 | Kameda et al. | |
| 8,041,882 B2 | 10/2011 | Jachalsky et al. | |
| 8,060,797 B2 | 11/2011 | Hida et al. | |
| 8,179,367 B2 | 5/2012 | Kitaura | |
| 2002/0124129 A1 | 9/2002 | Zilberman | |
| 2003/0084386 A1 | 5/2003 | Barth, Jr. et al. | |
| 2006/0053357 A1 * | 3/2006 | Rajski et al. ................ | 714/742 |
| 2006/0168475 A1 * | 7/2006 | Segers et al. ................ | 714/25 |
| 2006/0200726 A1 * | 9/2006 | Gittins et al. ............... | 714/763 |
| 2008/0052446 A1 | 2/2008 | Lasser et al. | |
| 2008/0209294 A1 | 8/2008 | Brink et al. | |
| 2010/0122148 A1 | 5/2010 | Flynn et al. | |
| 2010/0332949 A1 * | 12/2010 | d'Abreu et al. ............ | 714/766 |
| 2011/0010698 A1 | 1/2011 | Byom et al. | |
| 2011/0239064 A1 * | 9/2011 | Byom et al. ................. | 714/723 |
| 2011/0252289 A1 | 10/2011 | Patapoutian et al. | |

FOREIGN PATENT DOCUMENTS

EP   0794484   9/1997

OTHER PUBLICATIONS

Mohammad, M.G.; Saluja, K.K.;, "Electrical model for program disturb faults in non-volatile memories," VLSI Design, 2003. Proceedings. 16th International Conference on, vol., No., pp. 217-222, Jan. 4-8, 2003.*

Chan Huan Gim;, "A novel bitmap analysis technique—test sensitivity intensity bitmap," Physical and Failure Analysis of Integrated Circuits, 2002. IPFA 2002. Proceedings of the 9th International Symposium on the, vol., No., pp. 105-109, 2002.*

Jim Cooke, "Micron® e-MMC™ Embedded Memory Simplifies High-Capacity Storage for Mobile and Embedded Systems," pp. 1-7, 2007 Micron Technology, Inc.

* cited by examiner

*Primary Examiner* — Cynthia Britt
(74) *Attorney, Agent, or Firm* — Van Court & Aldridge LLP

(57) ABSTRACT

Systems and methods are disclosed for performing run-time tests on a non-volatile memory ("NVM"), such as flash memory. The run-time tests may be tests that are performed on the NVM while the NVM can be operated by an end user (as opposed to during a manufacturing phase). In some embodiments, a controller for the NVM may detect an error event that may be indicative of a systemic failure of a die of the NVM. The controller may then select one or more blocks in the die to test, which may be dies that are currently not being used to store user data. The controller may post process the results of the test to determine whether there is a systemic failure, such as a column failure, and may treat the systemic failure if there is one.

12 Claims, 3 Drawing Sheets

RUN-TIME TESTING OF MEMORY LOCATIONS IN A NON-VOLATILE MEMORY

FIELD OF THE INVENTION

This can relate to performing run-time testing of memory locations in a non-volatile memory, such as flash memory.

BACKGROUND OF THE DISCLOSURE

NAND flash memory, as well as other types of non-volatile memories ("NVMs"), are commonly used for mass storage. For example, consumer electronics such as portable media players or cellular telephones often include raw flash memory or a flash card to store music, videos, and other media.

Non-volatile memories may include initial defects. Thus, tests are typically performed on these non-volatile memories during their manufacturing phase to ensure that the initial defects do not exceed a predetermined threshold. Those non-volatile memories that pass the test may be configured to avoid using the memory cells that have the initial defects. These non-volatile memories may then be shipped for use by an end user or for packaging into an electronic device that can then be used by an end user.

Non-volatile memories, however, may develop further defects over time, such as due to over-erasing blocks of the non-volatile memory. These additional defects may be handled using error correcting codes or bad block management.

SUMMARY OF THE DISCLOSURE

Systems and methods are disclosed for performing run-time tests on memory locations of a non-volatile memory ("NVM"), such as NAND flash, in order to effectively manage the NVM. "Run-time" may refer generally to the time when the non-volatile memory is being used by an end user (e.g., when the NVM is disposed in a host device, such as a cellular telephone), as opposed to during the manufacturing or production phase. Thus, instead of performing tests during just the manufacturing phase of a NVM, tests may be employed while the NVM is being used out in the marketplace.

The non-volatile memory may be of any suitable type. For example, the non-volatile memory can include flash memory, such as one or more flash dies. Optionally, the NVM may be packaged with a NVM controller for managing the NVM, and therefore the NVM may be a managed NVM (e.g., managed NAND) or a raw NVM (e.g., raw NAND). The host device may include a host processor for controlling and managing the memory locations of the NVM and the data stored therein. For simplicity, components (e.g., the host processor or the NVM controller) that can manage a non-volatile memory may sometimes be referred to simply as a "controller."

In some embodiments, the controller may be configured to detect indications that a systemic failure in a die of the NVM has potentially occurred. That is, each die of the NVM may include multiple blocks, and the controller may be configured to determine when errors have occurred in at least one block of a die that may indicate a die-wide failure (i.e., affecting more than one of the blocks in the die). Such indicators of systematic failures may include, for example, certain patterns of failures, a large number of failures in a predetermined number of operations, a certain number of uncorrectable errors, or an increasing bit error rate of a block or die over time.

In response to detecting an indication of a potential systemic failure of a die, the controller may select one or more blocks in the die to test. Because a systemic failure may affect multiple blocks, the blocks chosen for the test may not need to include the blocks whose errors triggered the test. In some embodiments, the controller may choose one or more free (i.e., erased) blocks in the die. This way, the controller can avoid performing tests on blocks that are currently being used to store user data. In other embodiments, the controller may choose one or more blocks that are programmed with user data, and the controller may perform garbage collection on those blocks to free the blocks for testing.

The test performed on the chosen blocks can include any suitable type of test. In some embodiments, the test can include repeatedly programming a test pattern into the blocks, verifying the accuracy of the programming, and erasing the blocks for further programming.

In some embodiments, the controller may be configured to post process the results of the test in order to manage the die of the non-volatile memory. For example, the controller may use the results of the test to determine whether the original error events triggering the test was a die-wide, systemic failure or if the errors were block-specific. The controller may perform any suitable action in response to determining that there is a systemic failure. For example, the controller can provide a notification to the user (particularly if there is a gross die failure), or the controller can perform die-wide management functions. Such die-wide management can include remapping a column of the die (i.e., memory cells along a bit line) to another column in response to determining that there is a column failure. Other systematic failures may include, for example, row failures, peripheral circuitry failures, and error clusters.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Figure 1:
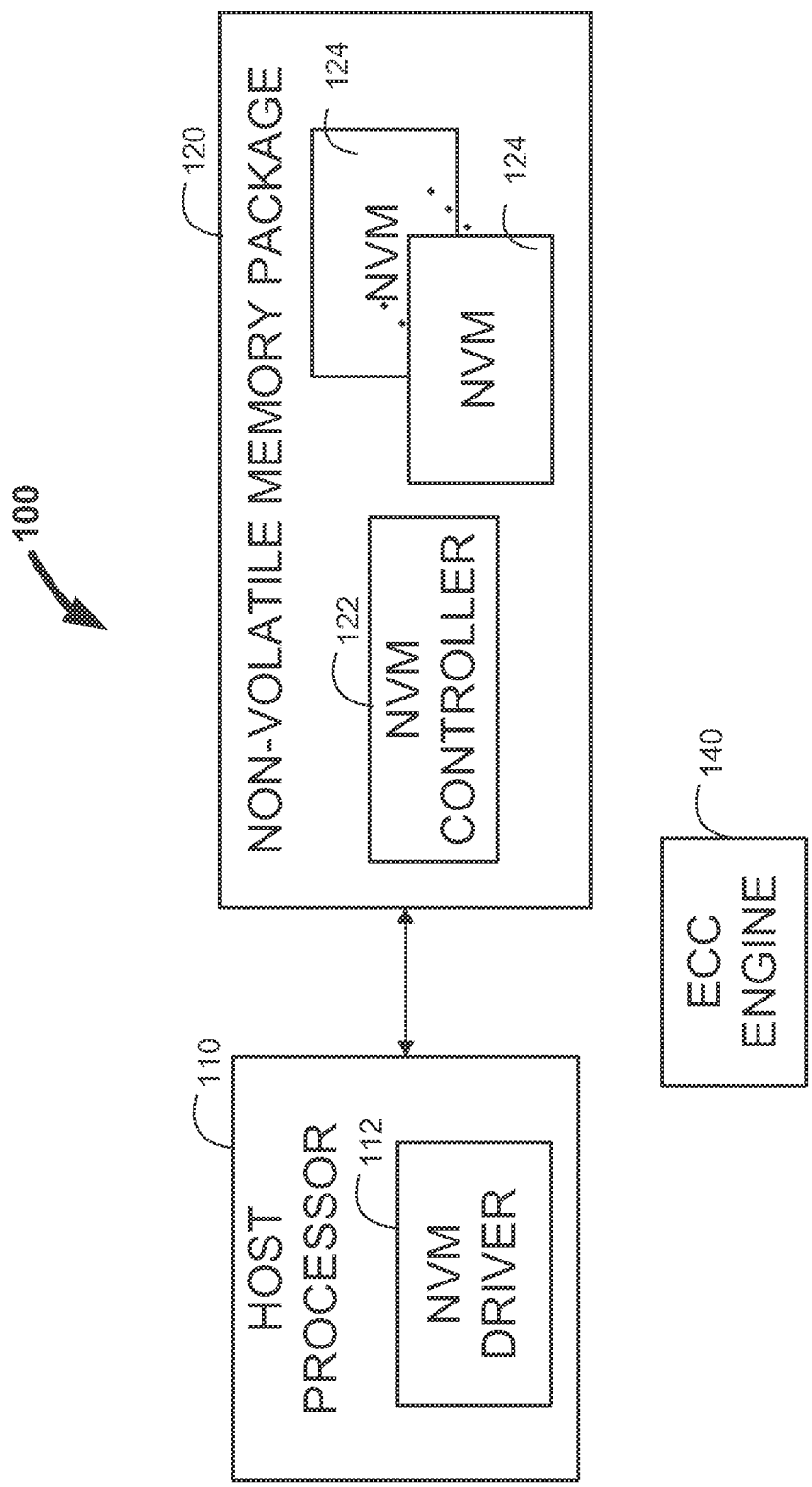
FIG. 1 is a schematic view of an illustrative memory system including a host processor and a non-volatile memory package configured in accordance with various embodiments of the invention.

FIG. 1 is a schematic view of memory system 100. Memory system 100 can include host processor 110, at least one non-volatile memory ("NVM") package 120, and error correction code ("ECC") engine 140. Host processor 110 and optionally NVM package 120 and ECC engine 140 can be implemented in any suitable host device or system, such as a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, or a laptop computer. For simplicity, the host device or system, which may include host processor 110, may sometimes be referred to simplicity as a "host."

Host processor 110 can include one or more processors or microprocessors that are currently available or will be developed in the future. Alternatively or in addition, host processor 110 can include or operate in conjunction with any other components or circuitry capable of controlling various operations of memory system 100 (e.g., application-specific integrated circuits ("ASICs")). In a processor-based implementation, host processor 110 can execute firmware and software programs loaded into a memory (not shown) implemented on the host. The memory can include any suitable type of volatile memory (e.g., cache memory or random access memory ("RAM"), such as double data rate ("DDR") RAM or static RAM ("SRAM")). Host processor 110 can execute NVM driver 112, which may provide vendor-specific and/or technology-specific instructions that enable host processor 110 to perform various memory management and access functions for non-volatile memory package 120.

NVM package 120 may be a ball grid array ("BGA") package or other suitable type of integrated circuit ("IC") package. NVM package 120 may be a managed NVM package or a raw NVM package. In a managed NVM implementation, NVM package 120 can include NVM controller 122 coupled to any suitable number of NVM dies 124. NVM controller 122 may include any suitable combination of processors, microprocessors, or hardware-based components (e.g., ASICs), and may include the same components as or different components from host processor 110. NVM controller 122 may share the responsibility of managing and/or accessing the physical memory locations of NVM dies 124 with NVM driver 112. Alternatively, NVM controller 122 may perform substantially all of the management and access functions for NVM dies 124. Thus, a "managed NVM" may refer to a memory device or package that includes a controller (e.g., NVM controller 122) configured to perform at least one memory management function for a non-volatile memory (e.g., one or more of NVM dies 124).

In a managed NVM implementation, host processor 110 can communicate with NVM controller 122 using any suitable communications protocol, such as a suitable standardized inter-processor protocol. For example, NVM package 120 may be included in a memory card (e.g., flash card), and host processor 110 and NVM controller 122 may communicate using Multimedia Memory Card ("MMC") or Secure Digital ("SD") card interfaces. In other embodiments, NVM package 120 may be included in a Universal Serial Bus ("USB") memory drive, and host processor 110 and/or NVM controller 122 may communicate via a USB protocol.

In some embodiments, non-volatile memory package 120 may be a raw NVM package. In these embodiments, NVM package 120 may not include NVM controller 122, and NVM dies 124 may be managed substantially completely by host processor 110 (e.g., via NVM driver 112). Thus, a "raw NVM" may refer to a memory device or package that may be managed entirely by a host controller or processor (e.g., host processor 110) implemented external to the NVM package.

Memory system 100 can include at least one ECC engine, including ECC engine 140, for protecting the integrity of data stored in NVM dies 124. ECC engine 140 can employ a suitable error correcting code ("ECC") or error detecting code ("EDC"), such as a Reed-Solomon ("RS") code, a Bose, Chaudhuri and Hocquenghem ("BCH") code, a cyclic redundancy check ("CRC") code, or any other suitable error correcting or detecting code. An ECC employed by ECC engine 140 may have any suitable strength. The "strength" of an ECC may indicate the maximum number of errors (e.g., bit flips) that may be corrected by the ECC.

ECC engine 140 may be implemented using any suitable software-based or hardware-based approach. For example, in some embodiments, ECC engine 140 may be software modules executed by host processor 110 or by NVM controller 122. In other embodiments, ECC engine 140 may be implemented using hardware (e.g., an ASIC), such as using one or more linear feedback shift registers ("LFSRs"). The ECC hardware may be included in NVM package 120 for access and use by NVM controller 122. Alternatively, the ECC hardware may be included with and accessed by host processor 110, and ECC engine 140 may be included on the same substrate as host processor 110 (e.g., on a system-on-a-chip ("SOC")). While memory system 100 is depicted as having one ECC engine, it should be understood that more than one ECC engine may be implemented.

NVM dies 124, which may be managed by host processor 110 and/or NVM controller 122, may be used to store information that needs to be retained when memory system 100 is powered down. As used herein, and depending on context, a "non-volatile memory" can refer to NVM dies in which data can be stored, or may refer to a NVM package that includes the NVM dies. NVM dies 124 can include NAND flash memory based on floating gate or charge trapping technology, NOR flash memory, erasable programmable read only memory ("EPROM"), electrically erasable programmable read only memory ("EEPROM"), ferroelectric RAM ("FRAM"), magnetoresistive RAM ("MRAM"), phase change memory ("PCM"), any other known or future types of non-volatile memory technology, or any combination thereof. FIG. 1, as well as later figures and various disclosed embodiments, may sometimes be described in terms of using flash technology. However, this is merely illustrative and not intended to be limiting.

The memory locations in each of NVM dies 124 can be organized into one or more "planes." The different planes can concurrently carry out access operations to its respective memory locations (e.g., program, read, and erase operations). The memory locations of each plane may be organized into "blocks" that may each be erasable at once, with its blocks further organized into pages that may each be programmable and readable at once. The blocks from corresponding NVM dies 124 (e.g., one block from each NVM die having the same position or block number) may form logical storage units referred to as "super blocks" for use by host processor 110 and/or NVM controller 122. NVM dies 124 may include any suitable number of planes, blocks, and pages. For example, in some embodiments, each NVM die 124 may include two planes, where each plane can include 2048 blocks.

As discussed above, host processor 110 and/or NVM controller 122 may perform any suitable set of memory management and access functions for NVM dies 124. Such memory management and access functions may include issuing read, write, and erase instructions, performing wear leveling, bad block management, garbage collection, logical-to-physical address mapping, SLC or MLC programming decisions, and recovery operations, applying error correction or detection using ECC engine 140, and data queuing to set up program operations. At least some of these management and access functions may be performed by a translation layer (e.g., executed as part of NVM driver 112), which may be a flash translation layer in flash memory embodiments.

Host processor 110 and/or NVM controller 122 may be configured to perform run-time tests on a suitable set of blocks from NVM dies 124 in order to manage NVM dies 124. A test may be referred to as a "run-time test" if the test occurs during operation of memory system 100 by an end user (as opposed to during the manufacturing phase of NVM package 120 or memory system 100). That is, host processor 110 and/or NVM controller 122 may perform these run-time tests even while user data (e.g., information generated by a user application) that needs to be maintained for the user is still stored in NVM dies 124.

In some embodiments, the tests may be run to determine whether there is a systemic, die-wide failure of one of dies 124. Examples of systemic failures that one or more of NVM dies 124 may suffer from include column failures (where memory cells along a bit line of the die are affected), row failures (where memory cells along a word line of the die are affected), failure of peripheral circuitry (e.g., charge pumps, row decoders, column decoders, registers, etc.), and error clusters (i.e., hot spots along a die). Such systemic or die-wide failures may cause symptoms that are present in multiple, if not all, of the blocks in the die at issue. For example, a symptom of a column failure may include errors at the same location of each page. For clarity, some of the disclosed embodiments may be described in terms of detecting and managing column failures. However, it should be understood that this is merely illustrative.

Figure 2:
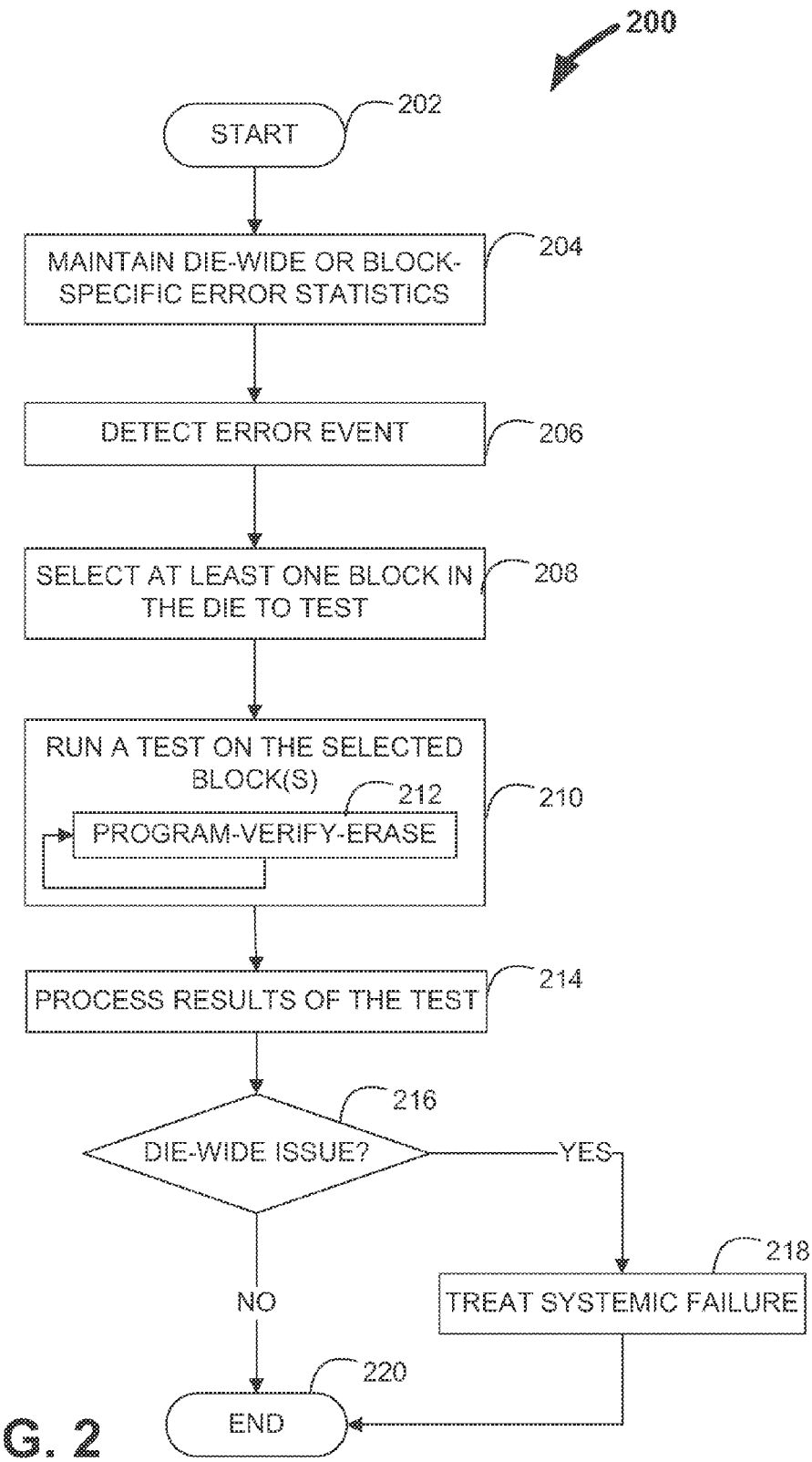
FIG. 2 is a flowchart of an illustrative process for performing run-time testing and post processing of memory locations of a non-volatile memory in accordance with various embodiments of the invention.

Referring now to FIG. 2, a flowchart of illustrative process 200 is shown for performing a run-time test and managing a non-volatile memory based on results of the test. Process 300 may be performed, for example, by host processor 110 and/or NVM controller 122, to detect and handle systemic failures of one or more of NVM dies 124. However, for simplicity, FIG. 2 (as well as FIG. 3) will be described as being performed by a "controller." It should be understood, however, that any suitable component may perform these processes.

Process 200 may begin at step 202. At step 204, the controller may maintain block-specific and/or die-wide error statistics. As described in greater detail below, these error statistics may be used to determine when an error event has occurred in a die that should trigger the start of a run-time test of the die. For example, the controller may keep track of the bit error rate ("BER") of each block in each die or of the overall BER for each die. In these embodiments, an error event may occur when the BER of a block or die has increased over time by a predetermined amount, since the increase may be due to errors caused by a systemic failure.

Other examples of error statistics, which may be maintained for each die, include recording addresses of where errors are occurring in order to identify error patterns in a die, keeping track of the number of failures that occurred versus the number of operation attempts for a block or die, and keeping track of the number of read operations that have resulted in errors that could not be corrected by an ECC engine (e.g., ECC engine 140 of FIG. 1).

Continuing to step 206, the controller can detect an error event in a die for triggering the initiation of a run-time test on that die. The error event may be detected using the error statistics maintained at step 204, such as by detecting a pattern in the error statistics or detecting that some error threshold or BER increase threshold has been met for a die. In some embodiments, the error event detected by the controller may include read, program, and erase failures in the die.

Once an error event has been triggered, process 200 may move to step 208. At step 208, the controller may select memory locations that will be used for running the test. Because the test is being performed at run-time, some portions of the die may include user data that needs to be maintained for the user of the memory system. Therefore, the entire die may not be tested during the run-time test. Instead, at step 208, the controller may select a portion of the blocks of the die being tested. Because the run-time test may be testing for systemic failures, which can have error symptoms that occur across multiple blocks, the controller may be able to select blocks for testing that do not correspond to the blocks whose errors triggered the controller to initiate the run-time test. That is, the controller does not need to test the blocks whose errors triggered the test, because testing other blocks may still reveal the symptoms of a systemic failure (e.g., column failure, row failure, etc.) of the die.

In some embodiments, step 208 may involve choosing at least one unused block in the die being tested. The unused blocks may be erased blocks (or blocks that are ready to be erased), which are not currently being used to store user data. In some embodiments, step 208 may involve choosing one or more blocks that are programmed with user data. In these embodiments, the controller may perform garbage collection on the programmed blocks so that the valid user data in the programmed blocks may be moved to another memory location, thereby freeing the selected blocks for testing. The controller may select which blocks to test using any suitable approach. For example, the controller may select unused or programmed blocks at random, the controller may select the block(s) whose errors triggered the start of the run-time test, or the controller may select one or more blocks that have been erased a similar number of times as the blocks whose errors triggered the start of the run-time test, or any combination thereof.

To select blocks for the run-time test, the controller may request these blocks from a translation layer (e.g., a flash translation layer). As discussed briefly above, a translation layer may be, for example, a software module executed by the controller that translates logical addresses (e.g., received from a file system of a operating system) to physical addresses of the non-volatile memory. Therefore, to reserve physical locations in a die to use for running a test (i.e., so that the translation layer does not attempt to store user data in that location before or during a run-time test), the controller may request the translation layer to reserve and provide the physical addresses of the blocks selected for the run-time test.

Process 200 may then continue to step 210, and the controller can run a test on the blocks selected at step 208. The test can include step 212, which involves performing multiple program-verify-erase iterations. For example, the controller may continually program the blocks with test patterns, verify the programming accuracy by reading back the programmed blocks (e.g., test for bit flips compared to the test patterns), and erase the blocks so that the same or different test patterns may be programmed into the blocks. The test patterns may include bit sequences designed to draw out specific types of errors. For example, to test for column failure, the controller may choose test patterns that may be more likely to cause errors at the location in each page corresponding to the column in question.

In some embodiments, step 210 can involve performing a directed test to test for a specific systemic failure. For example, the test may have been triggered at step 406 responsive to detecting symptoms of a particular systemic failure (e.g., column failure, row failure, etc.), and therefore the test at step 210 may be performed to review in more detail whether the symptoms are actually present die-wide. In other embodiments, step 210 can involve performing a general test to determine whether any of a predetermined number of systemic failures has occurred. For example, the controller can test for column failure, row failure, peripheral circuitry failure, and error clusters. The controller may test for each of these systemic failures by selecting different test patterns that may draw out the symptoms of the systemic failures.

It should be understood that the test performed at step 210 can be performed using the above-described approaches or using any other suitable approach. For example, the tests may include any of the features of the tests discussed in co-pending, commonly-assigned U.S. patent application Ser. No. 12/502,128, filed Jul. 13, 2009 and entitled "TEST PARTITIONING FOR A NON-VOLATILE MEMORY," which is hereby incorporated herein by reference in its entirety.

Continuing to step 212, the controller may post process the results of the test. During post processing, the controller may determine which, if any, of the systemic failures are present in the die. For example, if many pages of the selected blocks suffered from errors in the same bit position, the controller may interpret this as the likely presence of a column failure. If the errors from the test do not appear to have any sort of pattern indicative of one of the systemic failures, the controller may instead determine that the initial error event was a block-specific failure (i.e., errors affecting a particular block and not the rest of the die). Thus, if, at step 214, the controller determines that there is no die-wide, systemic failure that can be identified from the test results, process 200 may end at step 220 (where further processing to correct or manage a block-specific failure may or may not take place).

If, at step 214, the controller instead determines that there is a die-wide failure, process 200 may continue to step 218. At step 218, the controller can treat the systemic failure. In some embodiments, treating the systemic failure can involve providing a notification to the user that there is a problem with the non-volatile memory. This way, the user may be able to send the device in for repair before any further problems occur with the die or the NVM in general. This type of treatment may be used, for example, responsive to detecting a gross die failure. A gross die failure may refer to a failure that prevents the die from being usable (i.e., due to causes a large number of errors or an inability to perform certain operations, such as program, read, or erase operations).

In some embodiments, treating the systemic failure can involve managing the die so that certain memory locations (e.g., pages, blocks, etc.) are no longer used. For example, if post processing step 214 identified the presence of a column failure, the controller can remap the failed column to another column in the non-volatile memory at step 218. That is, instead of reading bit N of each page from the current die, the controller may obtain this bit from the column of another die. The controller may use metadata to handle this remapping. For gross die failures or other any other type of systemic failure, the controller may remap the entire die to another die so that the entire die is no longer used.

Process 200 may then end at step 220.

Figure 3:
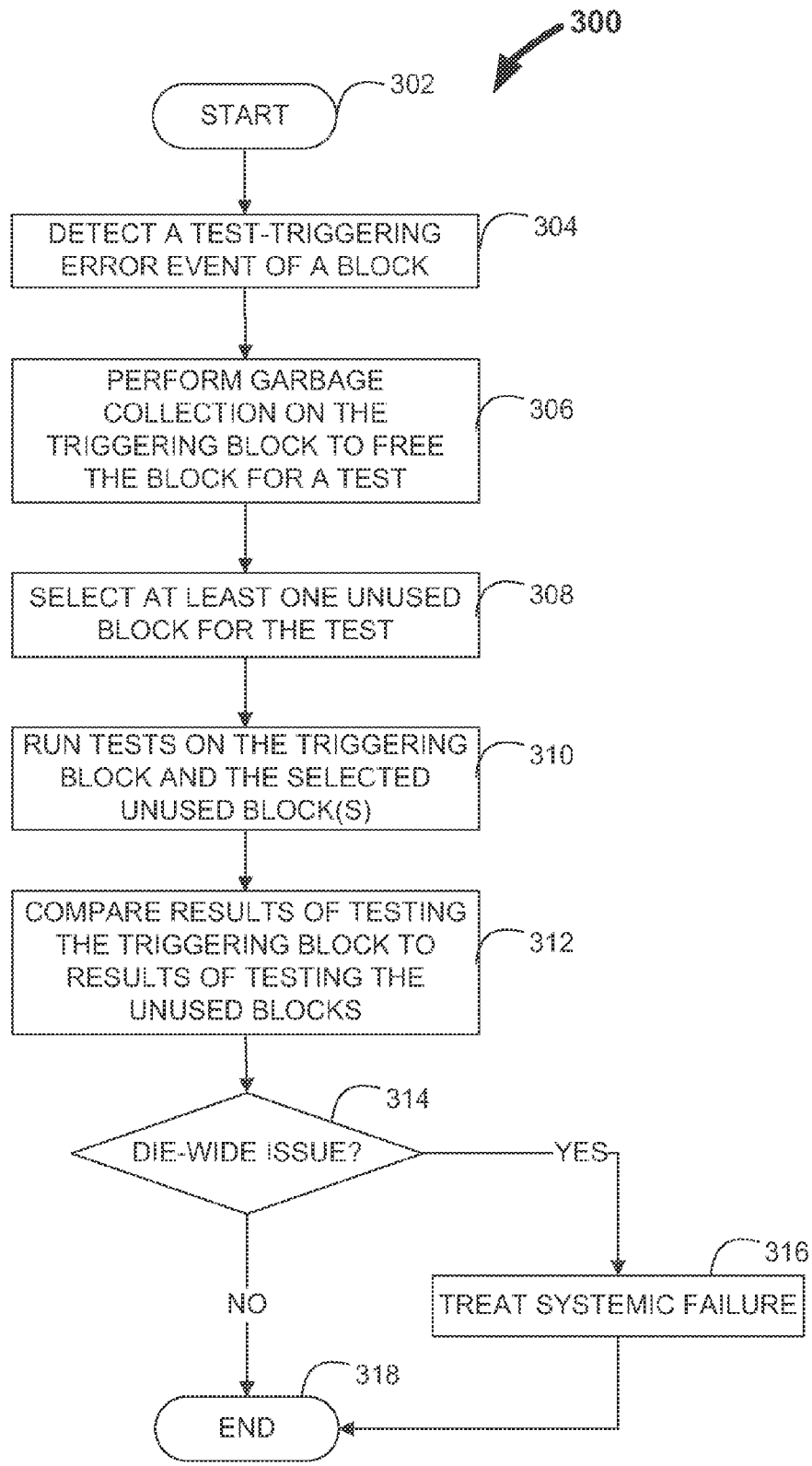
FIG. 3 is a flowchart of another illustrative process for performing run-time testing and post processing of memory locations of a non-volatile memory in accordance with various embodiments of the invention.

Referring now to FIG. 3, a flowchart of illustrative process 300 for performing a run-time test of a die of a non-volatile memory, such as NAND flash memory, and managing the non-volatile memory based on results of the test. Process 300 may be a more detailed view of one embodiment of process 200 of FIG. 2. Thus, it should be understood that any of the steps of process 300 may include some or all of the features of similar steps of process 200.

Process 300 may begin at step 302. At step 304, a controller may detect an error event that the controller may use to trigger a run-time test. The error event may be based on the performance or a sequence of events of a particular block in the die. This particular block may be referred to as the "test-triggering block" for clarity. The error event may include, for example, a sequence of uncorrectable errors read from pages in the test-triggering block, a program failure on the test-triggering block, an erase failure of the test-triggering block, or any suitable error of the test-triggering block that caused the error statistics of the test-triggering block or the die to meet some criterion for starting a run-time test.

As described above, the controller may then select which blocks in the die to run the test on. In some embodiments, the controller may select the test-triggering block. This way, the controller can further analyze the errors associated with the test-triggering block and to compare the errors of the test-triggering blocks with any errors that may be discovered by testing other blocks (as described below). Thus process 300 may continue to step 306. At step 306, the controller may perform garbage collection on the test-triggering block to free the test-triggering block of any user data currently stored in the test-triggering block. Then, at step 308, the controller may select at least one unused (e.g., erased) block to use when performing the test. Alternatively, the controller may garbage collect another block to free the programmed block for the test.

Process 300 may continue to step 310, where the controller may run tests on the test-triggering block and the blocks selected at step 308. The tests may include any of the tests described above in connection with testing step 210 of FIG. 2, and the tests run on the different blocks of the die may be the same test or different tests. Then, at step 312, the controller may compare the results of testing the test-triggering blocks to the results of testing the blocks selected at step 308. This way, the controller can determine whether the error event triggering the test was likely caused by a die-wide failure. For example, if the test-triggering block continually had a large number of errors during the test, but the other selected blocks did not, the controller may interpret this as there being a block-specific error in the test-triggering block instead of a systemic failure.

Thus, if, at step 316, the controller determines that there is no die-wide systemic failure, process 300 may end at step 320. Otherwise, the controller can treat the systemic failure at step 318, as discussed above.

It should be understood that processes 200 and 300 of FIGS. 2 and 3 are merely illustrative. Any of the steps in these processes may be removed, modified, or combined, and any additional steps may be added, without departing from the scope of the invention.

The described embodiments of the invention are presented for the purpose of illustration and not of limitation.

What is claimed is:

1. A method of managing a non-volatile memory using a processor, wherein the non-volatile memory comprises at least one die having a plurality of blocks, the method comprising:

maintaining error characteristics of the non-volatile memory;

detecting an error event indicative of a systematic failure of a die of the non-volatile memory, wherein the detecting comprises identifying a criterion in the error characteristics;

responsive to the detecting, selecting at least one unused block in the die;

performing a run-time test on the selected at least one unused block; and managing the die of the non-volatile memory based on results of the run-time test.

2. The method of claim 1, wherein maintaining the error characteristics comprises at least one: recording addresses of where error events are occurring in the die, keeping track of the bit error rate of the die, keeping track of the bit error rate of at least one of the blocks in the die, keeping track of the number of program or erase failures in a predetermined number of attempts, and keeping track of the number of uncorrectable error events in different blocks of the die.

3. The method of claim 1, wherein the detecting comprises detecting a pattern of errors in at least one block in the die.

4. The method of claim 1, further comprising:
performing garbage collection on another block of the die to free the block for the run-time test, wherein performing the run-time test comprises testing the another block.

5. The method of claim 1, wherein the performing comprises performing a plurality of iterations, each of the iterations comprising:
programming the at least one unused block with a predetermined pattern;
reading the at least one unused block to verify the accuracy of the programming; and
erasing the at least one unused block.

6. The method of claim 1, further comprising:
determining, based on the run-time test, whether the error event is likely caused by a block-specific error or a die-wide error, wherein the managing is performed based on the determining.

7. A non-transitory computer readable medium for controlling an electronic device comprising a non-volatile memory, wherein the non-volatile memory comprises at least one die having a plurality of blocks, the non-transitory computer readable medium comprising computer-readable code recorded thereon, the computer readable code comprising:
a first instruction code for maintaining error characteristics of the non-volatile memory;
a second instruction code for detecting an error event indicative of a systematic failure of a die of the non-volatile memory, wherein the detecting comprises identifying a criterion in the error characteristics;
a third instruction code for selecting at least one unused block in the die responsive to the detecting;
a fourth instruction code for performing a run-time test on the selected at least one unused block; and
a fifth instruction code for managing the die of the non-volatile memory based on results of the run-time test.

8. The non-transitory computer readable medium of claim 7, wherein maintaining the error characteristics comprises at least one: recording addresses of where error events are occurring in the die, keeping track of the bit error rate of the die, keeping track of the bit error rate of at least one of the blocks in the die, keeping track of the number of program or erase failures in a predetermined number of attempts, and keeping track of the number of uncorrectable error events in different blocks of the die.

9. The non-transitory computer readable medium of claim 7, wherein the detecting comprises detecting a pattern of errors in at least one block in the die.

10. The non-transitory computer readable medium of claim 7, further comprising:
a sixth instruction code for performing garbage collection on another block of the die to free the block for the run-time test, wherein performing the run-time test comprises testing the another block.

11. The non-transitory computer readable medium of claim 7, wherein performing the run-time test comprises performing a plurality of iterations, each of the iterations comprising:
programming the at least one unused block with a predetermined pattern;
reading the at least one unused block to verify the accuracy of the programming; and
erasing the at least one unused block.

12. The non-transitory computer readable medium of claim 7, further comprising:
a sixth instruction code for determining, based on the run-time test, whether the error event is likely caused by a block-specific error or a die-wide error, wherein the managing is performed based on the determining.

* * * * *